(12) United States Patent
Bramanti et al.

(10) Patent No.: US 11,552,191 B2
(45) Date of Patent: Jan. 10, 2023

(54) POWER DEVICE, SYSTEM INCLUDING THE POWER DEVICE, METHOD FOR MANUFACTURING THE POWER DEVICE, AND METHOD FOR CONTROLLING THE POWER DEVICE

(71) Applicant: STMICROELECTRONICS S.r.l., Agrate Brianza (IT)

(72) Inventors: Alessandro Paolo Bramanti, Maglie (IT); Alberto Pagani, Nova Milanese (IT); Antonello Santangelo, Belpasso (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 168 days.

(21) Appl. No.: 17/017,565

(22) Filed: Sep. 10, 2020

(65) Prior Publication Data

US 2021/0104626 A1 Apr. 8, 2021

(30) Foreign Application Priority Data

Sep. 12, 2019 (IT) .......................... 102019000016193

(51) Int. Cl.
| | | |
|---|---|---|
| G01R 33/07 | (2006.01) | |
| H01L 29/78 | (2006.01) | |
| H01L 49/02 | (2006.01) | |
| H01L 29/417 | (2006.01) | |
| H01L 43/06 | (2006.01) | |
| H01L 43/14 | (2006.01) | |
| H03K 17/687 | (2006.01) | |
| H03K 17/51 | (2006.01) | |

(52) U.S. Cl.
CPC .......... *H01L 29/7817* (2013.01); *G01R 33/07* (2013.01); *H01L 28/86* (2013.01); *H01L 29/41758* (2013.01); *H01L 43/065* (2013.01); *H01L 43/14* (2013.01); *H03K 17/687* (2013.01); *H03K 17/51* (2013.01)

(58) Field of Classification Search
CPC .. G01R 15/202; G01R 19/0092; G01R 33/07; H01L 27/22; H01L 27/0207; H01L 43/14; H01L 43/04; H01L 43/065
See application file for complete search history.

(56) References Cited

U.S. PATENT DOCUMENTS

| | | |
|---|---|---|
| 5,017,804 A | 5/1991 | Harnden et al. |
| 5,023,684 A | 6/1991 | Tsunoda |
| (Continued) | | |

OTHER PUBLICATIONS

Haned et al., "Nano-tesla magnetic field magnetometry using an InGaAs—AlGaAs—GaAs 2 DEG Hall sensor," *Sensors and Actuators*, A 102, pp. 216-222, 2003.

(Continued)

*Primary Examiner* — Dominic E Hawkins
(74) *Attorney, Agent, or Firm* — Seed IP Law Group LLP

(57) ABSTRACT

Various embodiments of the present disclosure provide a power device including at least one first conductive element adapted to generate a magnetic field when traversed by a current, and characterised in that it further comprises a Hall sensor electrically insulated from the first conductive element. The sensor and the first conductive element are mutually arranged so as to detect said magnetic field indicative of the current that traverses the first conductive element.

21 Claims, 8 Drawing Sheets

(56) References Cited

U.S. PATENT DOCUMENTS

| | | | |
|---|---|---|---|
| 6,424,018 | B1 | 7/2002 | Ohtsuka |
| 8,680,846 | B2* | 3/2014 | Cesaretti ............ G01R 33/0035 |
| | | | 702/183 |
| 10,197,602 | B1* | 2/2019 | Nehmeh .............. G01R 15/202 |
| 2013/0075724 | A1 | 3/2013 | Hirler et al. |
| 2014/0266159 | A1* | 9/2014 | Heremans ............ G01R 33/072 |
| | | | 324/207.2 |
| 2015/0219693 | A1 | 8/2015 | Sutera et al. |
| 2016/0049856 | A1 | 2/2016 | Zhang |
| 2016/0380181 | A1 | 12/2016 | Meyer et al. |
| 2019/0170838 | A1* | 6/2019 | George .............. G01R 33/3678 |
| 2019/0391185 | A1* | 12/2019 | El Bacha ............... G01R 33/07 |

OTHER PUBLICATIONS

Jiang et al., "Model analysis of multi-finger MOSFET layout in ring oscillator design," 12$^{th}$ International Symposium on Quality Electronic Design, pp. 347-352, 2011.

Roumenin, Handbook of Sensors and Actuators: Solid State Magnetic Sensors. *Elsevier*, vol. 2, pp. 113-117, 1994.

Emerald, "Non-Intrusive Hall-Effect Current-Sensing Techniques Provide Safe, Reliable Detection and Protection for Power Electronics," *Allegro MicroSystems, LLC*, STP98-1-AN, Rev. 2, pp. 1-19, 2013.

\* cited by examiner

POWER DEVICE, SYSTEM INCLUDING THE POWER DEVICE, METHOD FOR MANUFACTURING THE POWER DEVICE, AND METHOD FOR CONTROLLING THE POWER DEVICE

BACKGROUND

Technical Field

The present disclosure relates to a power device, to a system that includes the power device, to a method for manufacturing the power device and to a method for controlling the power device.

Description of the Related Art

As is known, power devices are electronic devices adapted to work at high voltages and currents, for example, with voltages that reach 1700 V during inhibition and up to several tens/hundreds of amps of current during conduction.

In particular, semiconductor power devices are known to be based, for example, on silicon, gallium nitride (GaN), silicon carbide (SiC), or gallium arsenide (GaAs). For instance, thanks to a high thermal capacity, GaN can operate up to approximately 400° C., has the possibility of sustaining high powers (even hundreds of watts) and can work at high frequencies (hundreds of megahertz). Therefore, GaN power devices find use in multiple fields of application. For instance, they are commonly used as switched-mode power supplies (SMPSs), audio amplifiers, motor controls, energy-conversion devices, devices used in the automotive field for hybrid and electric vehicles. Some examples of GaN power devices are power diodes, power transistors with finger-electrode structure, thyristors, metal-oxide-semiconductor field-effect transistors (MOSFETs), and super junction MOSFETs (SJ-MOS).

In particular, it is sometimes desirable to measure the current in semiconductor power devices, in particular in the ones that already integrate respective driver circuits therein. In fact, anomalous current absorption may lead to heating of the power device, which might cause damage thereof.

Different solutions to the above problem are known, amongst which the use of external measurement devices coupled to the power device (or to a system that integrates it), such as ammeters. However, this leads to a poor practicality and low convenience of use of the power device, due to the encumbrance and to the bulkiness of the external measuring device.

A further solution includes integration, within the system that comprises the power device, of one or more circuits dedicated to measurement of the current. These circuits are based, for example, on current mirrors that allow drawing off part of the current generated by the power device to measure it, thus obtaining information on the operation of the device itself. This solution is not galvanically insulated and therefore implies that the part of generated current that is adapted to be used for the measurement cannot be exploited operatively by the device during operation, i.e., that said part of current is subtracted from the output of the power device. To have an optimal sensitivity of measurement, each current mirror should include a sensing resistance $R_{sense}$ of a value roughly equal to at least 10% of the value of an ON-state resistance $R_{on}$ of the mirror itself. On account of this, the part of current dedicated to measurement is non-negligible with respect to the current generated by the GaN power device. Consequently, this solution reduces the performance of the GaN power device, decreasing the efficiency thereof. Moreover, it often involves a complex circuitry, and this increases the dimensions and the cost of the end product and causes an increase in the system response time to situations such as short-circuits or overcurrents.

BRIEF SUMMARY

Various embodiments of the present disclosure provide a power device, a system that includes the power device, a method for manufacturing the power device and a method for controlling the power device that will overcome the problems of the prior art.

BRIEF DESCRIPTION OF THE SEVERAL VIEWS OF THE DRAWINGS

For a better understanding of the present disclosure, various embodiments are now described, purely by way of non-limiting example, wherein.

DETAILED DESCRIPTION

In the ensuing description, elements that are common in the different embodiments are designated by the same reference numbers. So far, and hereinafter, when reference is made to GaN power devices, this is purely by way of example, in so far as the presented solutions may also be applied to power devices realized with other semiconductor materials, such as SiC and GaAs.

Figure 1:
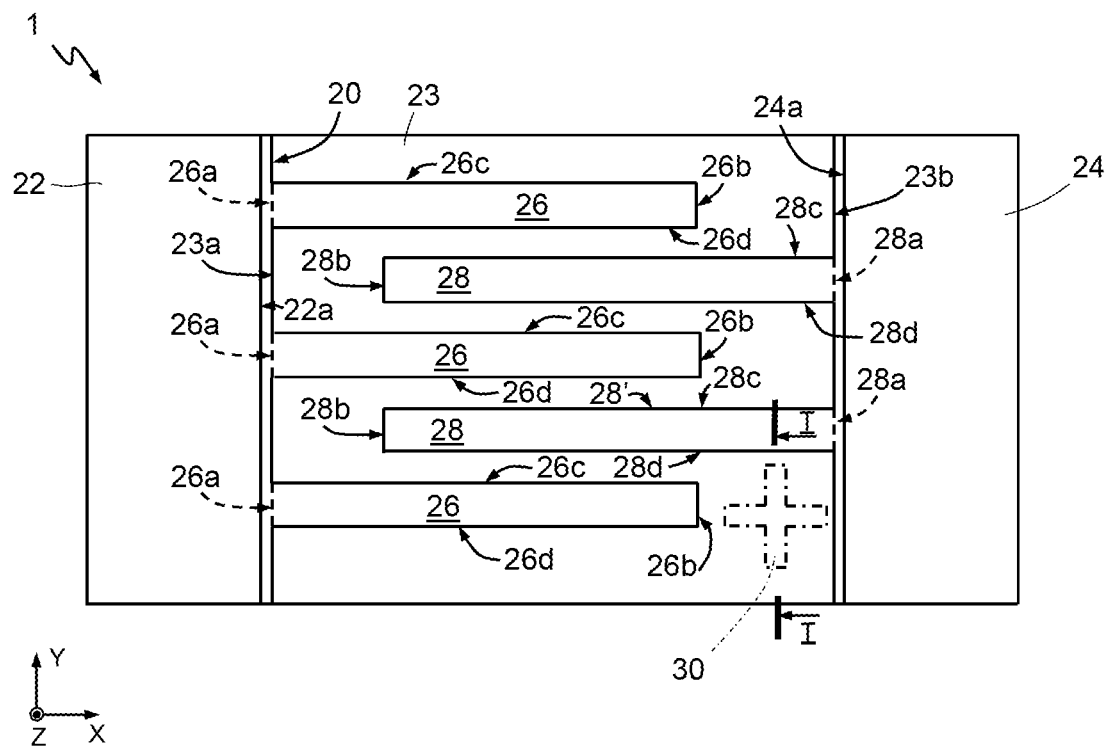
FIG. 1 is a section view of a power device, according to one embodiment of the present disclosure.

FIG. 1 shows a power device 1 in a Cartesian reference system of mutually orthogonal axes X, Y, Z. In particular, FIG. 1 shows a section view (taken along a section line designated by in FIG. 3) in a plane parallel to a plane XY defined by the axes X and Y of the power device 1, at the level of a metallization layer (second metallization layer MTL2 in FIG. 3) of the power device 1.

In the embodiment described by way of example, the power device 1 includes a high electron mobility field-effect transistor (HEMT) 20 with finger structure (referred to, in the following, simply as "transistor 20").

The power device 1 further comprises (for example, in integrated form) a sensor 30.

In FIG. 1, the sensor 30 is represented with a dashed line since it extends parallel to the metallization layer MTL2 but at a height, along Z, different from the height at which the metallization layer MTL2 extends.

Consequently, in what follows reference will be made to the ensemble of the transistor 20 and the sensor 30 as "power device 1".

With reference to FIG. 1, the transistor 20 is formed on or in a semiconductor body (illustrated in FIG. 3 with the reference number 5) and comprises a conductive source line 22 (referred to, in the following, as "source bus 22") and a conductive drain line 24 (referred to, in the following, as "drain bus 24"), separated from one another by an insulating region 23 (for example, of silicon dioxide $SiO_2$, or silicon nitride $Si_3N_4$, or some other dielectric material), which guarantees corresponding electrical insulation thereof. In the embodiment of FIG. 1, the source bus 22 has a surface 22a (parallel to a plane YZ defined by the axes Y and Z) facing a first surface 23a (parallel to the plane YZ) of the insulating region 23, and the drain bus 24 has a surface 24a parallel to the plane YZ and facing a second surface 23b (parallel to the plane YZ) of the insulating region 23. The insulating region 23 therefore extends between the source bus 22 and the drain bus 24 along the axis X. Moreover, the source bus 22 is electrically connected to a source pad (not illustrated), adapted to be set in use at a source voltage $V_{source}$, whereas the drain bus 24 is electrically connected to a drain pad (not illustrated), adapted to be set in use at a drain voltage $V_{drain}$.

A plurality of source fingers 26 extend through the insulating region 23 and are electrically connected to the source bus 22. In FIG. 1 three source fingers 26 are illustrated, even though the number may vary, as is in itself obvious to the person skilled in the art. In the embodiment represented by way of example in the section view of FIG. 1, the source fingers 26 have a rectangular shape and are the same as one another, with main extension parallel to the axis X. In particular, each source finger 26 has: a first minor side 26a parallel to the axis Y (i.e., extending along a width of the rectangular shape) and adjacent to the surface 22a of the source bus 22; a second minor side 26b parallel to the axis Y (i.e., extending along a width of the rectangular shape) and to the first minor side 26a (opposite thereto with respect to the considered source finger 26), and facing the drain bus 24; a first major side 26c parallel to the axis X (i.e., extending along a length of the rectangular shape) and perpendicular to the minor sides 26a, 26b; and a second major side 26d parallel to the axis X (i.e., extending along a length of the rectangular shape) and to the first major side 26c, perpendicular to the minor sides 26a, 26b, and opposite, with respect to the considered source finger 26, to the first major side 26c. Each source finger 26 is electrically connected to the source bus 22 at the first minor side 26a, while the insulating region 23 electrically insulates each source finger 26 at the second minor side 26b and the major sides 26c, 26d.

Likewise, a plurality of drain fingers 28 extend through the insulating region 23 and are electrically connected to the drain bus 24. FIG. 1 represents two drain fingers 28, but the number varies in a way in itself obvious to the person skilled in the art. In the embodiment represented by way of example in the section view of FIG. 1, the drain fingers 28 have a rectangular shape and are the same as one another, with main extension parallel to the axis X. In particular, each drain finger 28 has: a first minor side 28a parallel to the axis Y (i.e., extending along a width of the rectangular shape) and adjacent to the surface 24a of the drain bus 24; a second minor side 28b parallel to the axis Y (i.e., extending along a width of the rectangular shape) and to the first minor side 28a (opposite thereto with respect to the considered drain finger 28), and facing the source bus 22; a first major side 28c parallel to the axis X (i.e., extending along a length of the rectangular shape) and perpendicular to the minor sides 28a, 28b; and a second major side 28d parallel to the axis X (i.e., extending along a length of the rectangular shape) and to the first major side 28c, perpendicular to the minor sides 28a, 28b, and opposite, with respect to the considered drain finger 28, to the first major side 28c. Each drain finger 28 is electrically connected to the drain bus 24 and to the other drain fingers 28 at the first minor side 28a, while the insulating region 23 electrically insulates each drain finger 28 at the second minor side 28b and the major sides 28c, 28d.

The source fingers 26 and drain fingers 28 have an interdigitated structure. In other words, each source finger 26 extends at least partially between two drain fingers 28, and each drain finger 28 extends at least partially between two source fingers 26. In particular, each source finger 26 has: the first major side 26c facing, at least partially, the second major side 28d of a respective drain finger 28; and the second major side 26d facing, at least partially, the first major side 28c of a respective and further drain finger 28. Likewise, each drain finger 28 has: the first major side 28c facing, at least partially, the second major side 26d of a respective source finger 26; and the second major side 28d facing, at least partially, the first major side 26c of a respective and further source finger 26. Consequently, the insulating region 23 electrically insulates each source finger 26 (respectively, drain finger 28) from the two drain fingers 28 (respectively, source fingers 26) close to and facing it.

More in general, each source finger 26 is adjacent, at least partially, to a drain finger 28, and each drain finger 28 is adjacent, at least partially, to a source finger 26. In detail, the distance (in particular, along the axis X) between the minor sides 26b of the source fingers 26 and the second surface 23b of the insulating region 23 may be equal to the distance (in particular, along the axis X) between the minor sides 28b of the drain fingers 28 and the first surface 23a of the insulating region 23. Moreover, the distance (in particular, along the axis Y) between the second major side 26d of each source finger 26 and the first major side 28c of the drain finger 28 facing it may be equal to the distance (in particular, along the axis Y) between the first major side 26c of each source finger 26 and the second major side 28d of the drain finger 28 facing it. Moreover, fingers 26, 28 facing and close to one another are positioned so as to have the second major side 26d of the source finger 26 and the first major side 28c of the drain finger 28 facing it (respectively, the first major side 26c of the source finger 26 and the second major side 28d of the drain finger 28 facing it) facing one another for at least 80% of their extension.

As is known, the current that traverses each source finger 26 is higher at the source bus 22 and decreases moving away from the source bus 22 towards the drain bus 24, along the axis X. In other words, there exists a gradient of current density in each source finger 26, the current of which decreases from the first minor side 26a to the second minor side 26b. Likewise, the current that traverses each drain finger 28 is higher at the drain bus 24 and decreases moving away from the drain bus 24 towards the source bus 22, along the axis X. In other words, there exists a gradient of current density in each drain finger 28, the current of which decreases from the first minor side 28a to the second minor side 28b.

Figure 1A:
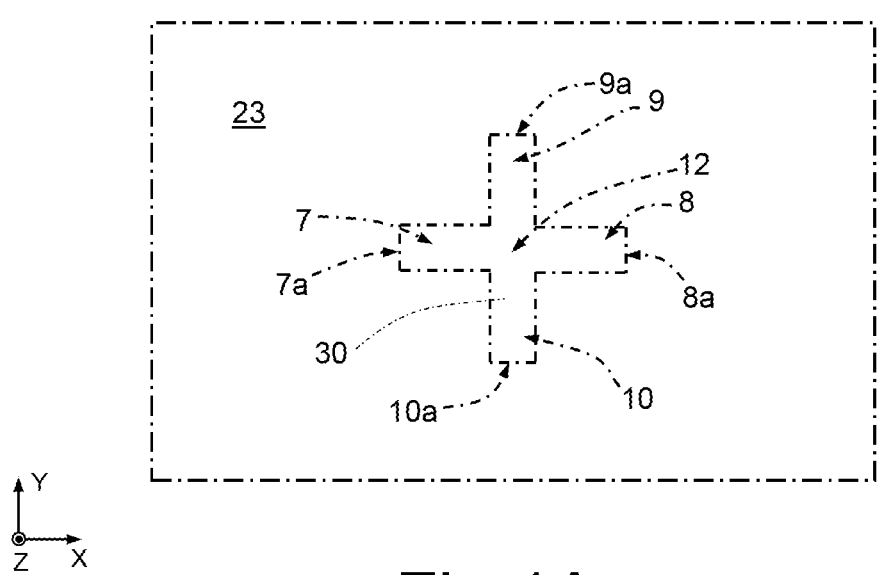
FIG. 1A shows an enlarged detail of the power device of FIG. 1, according to one embodiment of the present disclosure.

With reference to FIGS. 1 and 1A, the sensor 30 is a Hall-effect magnetic sensor. In particular, the Hall effect contemplates setting-up of a difference of potential (referred to as "Hall potential" and designated by $V_H$ in FIG. 2) between two different points of a conductive material traversed by a current ($I_a$ in FIG. 2, orthogonal to the Hall potential $V_H$), in the presence of a measured magnetic field ($B_s$ in FIG. 2) orthogonal both to the electrical current and to the Hall potential $V_H$.

Since a conductor traversed by current generates a magnetic field, each finger 26, 28 will contribute to generating a respective magnetic field B. In detail, considering the ideal case of an infinite rectilinear wire (therefore having an infinitesimal cross-section) in vacuum traversed by a stationary current I, it is known from the Biot-Savart law that the magnetic field B(r) in a point P in space can be calculated as:

$$B(r) = \frac{\mu_0 I}{2\pi} \cdot \frac{\hat{1} \times \hat{r}}{|r|}$$

where r is the minimum distance of the point P from the wire ($\hat{r}$ is the unit vector of r), $\hat{1}$ is the unit vector of the stationary current I, and $\mu_0$ is the vacuum magnetic permeability. This expression may be extended in a per se known manner to the person skilled in the art also to the case of a medium with a permittivity different from vacuum, and to the case of wires with non-negligible section, such as the fingers 26, 28 of the transistor 20. In particular, a conductor with non-negligible section (such as one of the fingers 26, 28, considering the ideal case where its main extension is infinite) can be treated as a "continuum" of conductors of infinitesimal section, each traversed by an infinitesimal current equal to the current density in the considered finger 26, 28. The contribution to the magnetic field of each infinitesimal conductor is therefore obtained by integrating the field calculated by applying the Biot-Savart law to each of these conductors. The result is obviously approximate, in so far as it does not take into account the finite major dimension of the finger 26, 28 and the consequent effects on the field geometry, nor the already described variable current density along the extension of the finger itself. Notwithstanding this, the present applicant has found that this result represents in any case a reliable and computationally fast estimate of the magnetic field B. In a per se known manner to the person skilled in the art, precise spatial distributions of the magnetic field B are obtained via simulations, for example, three-dimensional simulations based on the finite-element method.

By associating the sensor 30 to the transistor 20 it is possible to measure the magnetic field B generated by the fingers 26, 28, in the proximity of the sensor 30 and therefore to calculate the current that traverses it. In this way, it is possible to monitor operation of the transistor 20 via a measurement of the current that traverses each finger 26, 28 conducted without drawing off part of said current (i.e., by making a galvanically insulated measurement) and thus without reducing the efficiency of the transistor 20.

Figure 2:
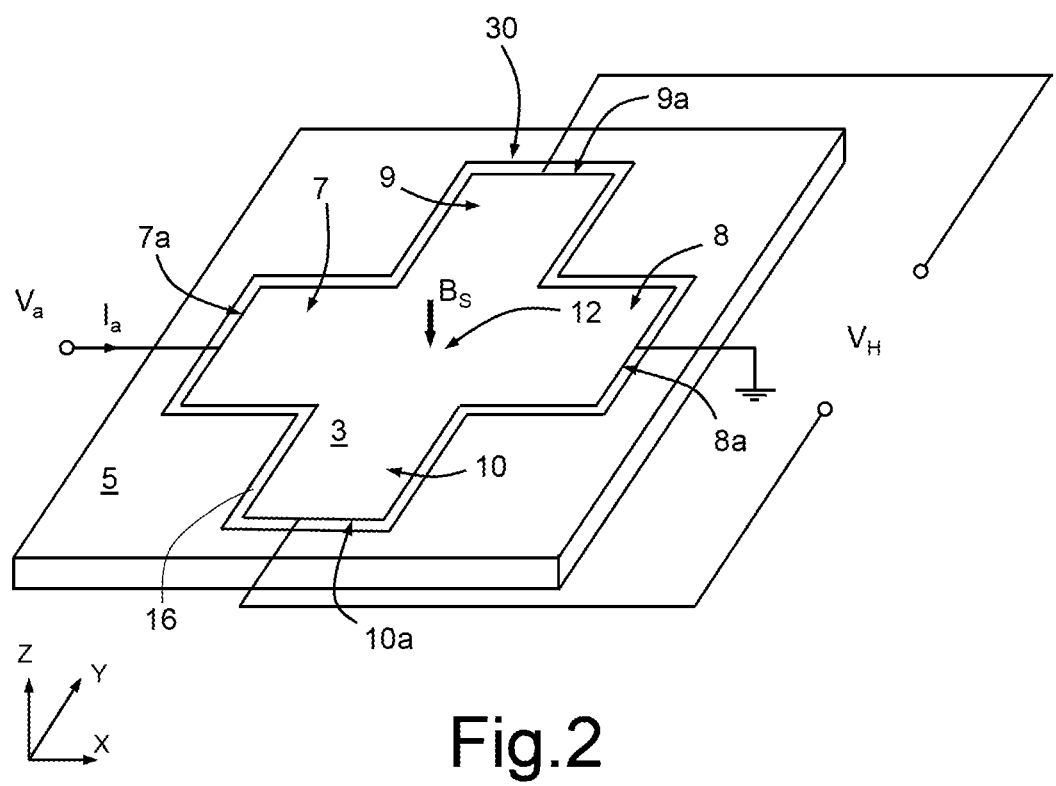
FIG. 2 is a schematic perspective view of the detail of FIG. 1A of the power device, according to one embodiment of the present disclosure.

In detail, FIG. 2 schematically shows an embodiment of the sensor 30, based on a conductive structure shaped like a cross (more in particular a cross with perpendicular arms of equal length, also known as "Greek cross"). The sensor 30 in FIG. 2 extends in a plane (section line II-II in FIG. 3) parallel to the plane XY, and in particular parallel to the section illustrated in FIG. 1.

The sensor 30 comprises a conductive region 3 formed on or in the semiconductor body 5. According to one embodiment, the conductive region 3 extends in a plane XY defined by the axes X and Y, and has four arms 7, 8, 9, 10. In the embodiment described by way of example, the conductive region 3 comprises a stack 14 (FIG. 3) of semiconductor materials adapted to form a two-dimensional electron gas (2DEG) region. In particular, as described hereinafter, the stack of semiconductor materials includes one or more heterostructures. The conductive region 3 is laterally insulated from the rest of the semiconductor body 5 by an insulating layer 16, as better described hereinafter.

According to one embodiment, a first arm 7 of the conductive region 3 is electrically connected to a supply source $V_a$, whereas a second arm 8, in continuation of the first arm 7, is electrically connected to a reference potential (for example, equal to 0V). A third arm 9 and a fourth arm 10, in continuation of one another, are arranged orthogonally to the first arm 7 and to the second arm 8. In FIG. 2, the first and second arms 7, 8 extend parallel to the axis X and the third and fourth arms 9, 10 extend parallel to the axis Y. Moreover, the arms 7-10 meet in a central area 12, which is the centre (or rather, centroid) of the cross formed thereby. The arm 7 has an end (referred to hereinafter as first outer end 7a) opposite to the central area 12 with respect to the extension of the arm 7; the arm 8 has an end (referred to hereinafter as second outer end 8a) opposite to the central area 12 with respect to the extension of the arm 8; the arm 9 has an end (referred to hereinafter as third outer end 9a) opposite to the central area 12 with respect to the extension of the arm 9; and the arm 10 has an end (referred to hereinafter as fourth outer end 10a) opposite to the central area 12 with respect to the extension of the arm 10.

In the embodiment described by way of example, the Hall potential $V_H$ is measured electrically between mutually opposite ends of the third and fourth arms 9, 10 (i.e., between the third and fourth outer ends 9a, 10a), for example, by a per se known high-impedance measurement. A supply current $I_a$ flows from the first arm 7 towards the second arm 8 along the axis X and, in the presence of the measured magnetic field $B_s$ (corresponding to a component of the magnetic field B generated by at least one of the fingers 26, 28, as better described), the Hall potential $V_H$ is generated along the axis Y, as a consequence of the Lorentz force.

In fact, charge carriers (in the present embodiment, electrons) in conduction in the conductive region 3 are affected by the Lorentz force $\bar{F}$, in vector form, according to the expression:

$$\bar{F} = q\bar{v} \times \bar{B}_s$$

where q is the charge of an electron, $\bar{v}$ is a drift-velocity vector of the electron (i.e., the velocity of the electron imposed by the supply current $I_a$), and $\bar{B}_s$ is a vector indicating the measured magnetic field $B_s$. On account of the Lorentz force, the simultaneous presence in the sensor 30 of the supply current $I_a$ and of the measured magnetic field $B_s$ generates a nonzero component in the direction Y along the trajectory of the electrons, and therefore a difference of potential between the third and fourth arms 9, 10 (i.e., the Hall potential $V_H$).

The sensor 30 is set in proximity of at least one of the fingers 26, 28.

According to the embodiment of FIG. 1, the third arm 9 of the sensor 30 faces one of the drain fingers 28. In top view, in the plane XY, said drain finger 28 and the sensor 30 are laterally staggered; i.e., the drain finger 28 is not vertically set above (along the axis Z) the sensor 30. In particular, the third outer end 9a faces the second major side 28d of the considered drain finger 28, and the third arm 9 has a main extension perpendicular to said second major side 28d. The first and second arms 7, 8 of the sensor 30 have a main extension along the axis X, parallel to said second major side 28d. Moreover, the fourth outer end 10a, opposite to the third outer end 9a along the axis Y, does not face any source finger 26 of the transistor 20 (in particular, there does not exist any source finger 26, the first major side 26c of which faces the second major side 28d of the considered drain finger 28, and therefore the fourth outer end 10a). The central area 12 of the sensor 30 is closer to at least one between the first and second major sides 28c, 28d of the considered drain finger 28 than to each of the first and second major sides 28c, 28d of the remaining drain fingers 28. In detail, the sensor 30 is arranged so that there exists a first minimum path or distance between the central area 12 and at least one between the first and second major sides 28c, 28d of the considered drain finger 28. The above first minimum path is shorter than any other path between the central area 12 of the sensor 30 and each of the first and second major sides 28c, 28d of the remaining drain fingers 28. In FIG. 1, the considered drain finger 28 is also designated by the reference number 28'. Moreover, the central area 12 of the sensor 30 is closer to the first minor side 28a than to the second minor side 28b of the considered drain finger 28 so as to measure the current that traverses the drain finger 28 where it is higher. In detail, a second minimum path between the central area 12 and the first minor side 28a of the considered drain finger 28 is shorter than a third minimum path between the central area 12 and the second minor side 28b of the considered drain finger 28.

According to a different embodiment, the third arm 9 of the sensor 30 faces one of the source fingers 26. In top view, in the plane XY, said source finger 26 and the sensor 30 are laterally staggered, i.e., the source finger 26 is not vertically set above (along the axis Z) the sensor 30. In particular, the third outer end 9a faces the second major side 26d of the considered source finger 26, and the third arm 9 has a main extension perpendicular to the aforesaid second major side 26d; the first and second arms 7, 8 of the sensor 30 have a main extension along the axis X, parallel to the aforesaid second major side 26d. Moreover, the fourth outer end 10a, opposite to the third outer end 9a along the axis Y, does not face any drain finger 28 of the transistor 20 (in particular, there does not exist any drain finger 28, the first major side 28c of which faces the second major side 26d of the considered source finger 26, and therefore the fourth outer end 10a). In detail, the sensor 30 is arranged so that there exists a fourth minimum path between the central area 12 and at least one between the first and second major sides 26c, 26d of the considered source finger 26. The aforesaid fourth minimum path is shorter than any other path between the central area 12 of the sensor 30 and each of the first and second major sides 26c, 26d of the remaining source fingers 26.

According to a further embodiment, the sensor 30 extends between one of the source fingers 26 and one of the drain fingers 28, and in particular the outer end 7a, 8a, 9a, 10a of one of the arms 7, 8, 9, 10 faces the first major side 26c of the source finger 26 (respectively, the second major side 26d of the source finger 26) and the outer end 7a, 8a, 9a, 10a of the arm 7, 8, 9, 10 opposite with respect to the central area 12 faces the second major side 28d of the drain finger 28 (respectively, the first major side 28c of the drain finger 28). In detail, a fifth minimum path between the central area 12 and the first major side 26c of the source finger 26 (respectively, the second major side 26d of the source finger 26) is different from a sixth minimum path between the central area 12 and the second major side 28d of the drain finger 28 (respectively, the first major side 28c of the drain finger 28). In general, the position of the sensor 30 between the source finger 26 and the drain finger 28 is chosen, in a per se known manner to the person skilled in the art, so as to prevent vanishing or excessive weakening of the magnetic field B in the proximity of the sensor 30 due to superposition of the contributions of the considered fingers 26, 28. For instance, the third outer end 9a faces the second major side 28d of the drain finger 28, whereas the fourth outer end 10a faces the first major side 28c of the drain finger 28.

Figure 3:
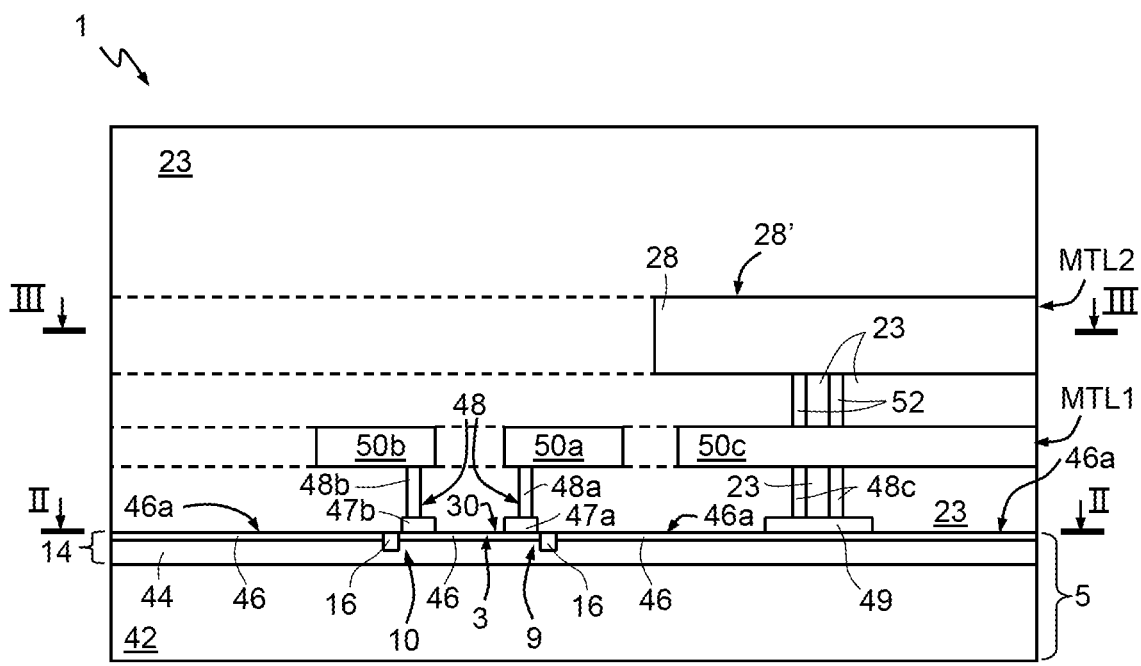
FIG. 3 is a section view of a detail of the power device of FIG. 1, taken along a section line I-I of FIG. 1, according to one embodiment of the present disclosure.

FIG. 3 is a section view along a plane parallel to the plane YZ, taken along the section line I-I(FIG. 1). In particular, the section view of FIG. 3 shows, at least partially, the sensor 30 and one of the drain fingers 28. Even though the ensuing description is made with reference to one of the drain fingers 28, the same applies with reference to one of the source fingers 26 and/or to the simultaneous presence of one of the drain fingers 28 and one of the source fingers 26. Moreover, the present description and the figures omit the presence of gate pads, gate fingers, and connections for the one or more gate terminals of the transistor 20, as they are in themselves known.

In particular, the power device 1 described by way of example in FIG. 1 comprises the semiconductor body 5, including a semiconductor substrate 42 (for example, of silicon with crystallographic orientation of a 111 type) and the stack 14, for example, formed epitaxially on the semiconductor substrate 42. According to one embodiment, the stack 14 includes a layer of gallium nitride (GaN) 44 and a layer of aluminium and gallium nitride (AlGaN) 46. The GaN layer 44 is interposed, along the axis Z, between the semiconductor substrate 42 and the AlGaN layer 46; moreover, the AlGaN layer 46 has a surface (hereinafter, top surface 46a, corresponding to the section line II-II) opposite to the GaN layer 44 with respect to the AlGaN layer 46. The GaN layer 44 contacts the AlGaN layer 46 to form a heterostructure, adapted to generate a 2DEG layer (which extends in the proximity of, and in particular at, the interface between the GaN layer 44 and the AlGaN layer 46) in a per se known manner. The GaN layer 44 may have a thickness, in a direction parallel to the axis Z, that ranges approximately between 300 nm and 1.5 µm, whereas the AlGaN layer 46 (for example, $Al_{0.3}Ga_{0.7}N$) may have a thickness, in a direction parallel to the axis Z, that ranges approximately between 10 nm and 40 nm. It may be noted that, in other implementations (not illustrated) further layers could be present, in a per se known way to the person skilled in the art, for example, between the semiconductor substrate 42 and the AlGaN layer 46.

A part (corresponding to the conductive region 3) of the AlGaN layer 46 is electrically insulated, via the insulating layer 16 (of dielectric or insulating material, such as $SiO_2$ or $Si_2N_4$), from the remaining part of the AlGaN layer 46. In fact, the insulating layer 16 surrounds the perimeter of the conductive region 3 entirely (as may be seen in FIG. 2) and extends in the stack 14 so as to insulate electrically the 2DEG present in the conductive region 3 from the 2DEG present outside the conductive region 3 (i.e., the 2DEG involved in conduction of the transistor 20 during use), thus rendering the sensor 30 galvanically insulated with respect to the transistor 20. The insulating layer 16 therefore defines the form of the sensor 30 (in the embodiment described by way of example, being a ballistic device). In particular, the insulating layer 16 extends in the stack 14 and has: a width, in a direction parallel to the axis Y, that ranges approximately between 200 nm and 2 µm; and a thickness, in a direction parallel to the axis Z, equal to approximately 100-300 nm starting from the top surface 46a of the AlGaN layer 46, so as to interrupt the 2DEG layer. The thickness of the insulating layer 16 is therefore greater than the thickness of the AlGaN layer 46, and the insulating layer 16 extends also, at least partially, in the GaN layer 44. Consequently, the conductive region 3 is laterally insulated from the semiconductor body 5, where by "laterally insulated" it is meant that, even though there are possible leakage currents (for example, lower than 1% of the conduction current) between the conductive region 3 and the semiconductor body 5 (in detail, the remaining part of the 2DEG layer, not comprised by the conductive region 3), the conductive region 3 is not involved in conduction of the transistor 20. In particular, this occurs since the conduction current flows in the 2DEG and since the insulating layer 16 electrically insulates the 2DEG present in the conductive region 3 from the 2DEG present outside the conductive region 3, therefore making the conductive region 3 of the sensor 30 galvanically insulated from the transistor 20.

A first terminal 47a and a second terminal 47b (of conductive material, such as metal, for example, tungsten, W, aluminium, Al, or copper, Cu, or even polysilicon) extend on the top surface 46a of the AlGaN layer 46 and are set, respectively, at the part of conductive region 3 adapted to function as third arm 9 and the part of conductive region 3 adapted to function as fourth arm 10. The first terminal 47a and the second terminal 47b are in electrical contact with the third arm 9 and the fourth arm 10, respectively. According to one embodiment, the first terminal 47a and the second terminal 47b are adapted to acquire the Hall potential $V_H$ generated during use of the sensor 30.

Moreover, FIG. 3 shows a drain terminal 49 that extends over the top surface 46a of the AlGaN layer 46 in a region of the stack 14 adapted to function as drain region of the transistor 20. In use, conduction of the transistor 20 occurs via a conduction current that flows in the 2DEG between a source region (similar to the drain region, and is electrically connected to one of the source fingers 26) and the drain region (which is electrically connected to one of the drain fingers 28), and is controlled via the gate terminal (arranged on the top surface 46a of the AlGaN layer 46 so as to control conduction of the transistor 20) in a per se known way. In a per se known way, the source bus 22 and the drain bus 24 could also be connected to the 2DEG layer via doping or by creating a conductive connection of a metal type. It may be noted that the transistor 20 typically includes a plurality of source regions (and a respective plurality of source terminals, each one electrically connected to a respective source finger 26) and a plurality of drain regions (and a respective plurality of drain terminals 49, each one electrically connected to a respective drain finger 28), extending parallel to the axis X.

Moreover, in FIG. 3 a first metallization layer MTL1 and a second metallization layer MTL2 extend on the stack 14. In particular, the first metallization layer MTL1 extends between the stack 14 and the second metallization layer MTL2. The first and second metallization layers MTL1, MTL2 are of conductive material, such as metal, for example, Al or Cu, and are buried in, and electrically insulated from one another through, the insulating region 23. The insulating region 23 may therefore be formed by one or more layers of dielectric material alternated with the metallization layers MTL1, MTL2. In particular, the insulating region 23 extends over, and in contact with, the top surface 46a of the AlGaN layer 46 and over the insulating layer 16. The first metallization layer MTL1 illustrated in FIG. 3 includes a first portion 50a, a second portion 50b, and a third portion 50c, which are not in direct electrical contact with one another.

The first portion 50a is electrically connected to the first terminal 47a (and therefore to the third arm 9) via a first contact (via) 48a (of conductive material such as metal, for example, Al or Cu), extending through the insulating region 23. The second portion 50b is electrically connected to the second terminal 47b (and therefore to the fourth arm 10) via a second contact 48b (of conductive material such as metal, for example, Al or Cu), extending through the insulating region 23. The third portion 50c is electrically connected to the drain terminal 49 via one or more third contacts 48c (of conductive material, such as tungsten or polysilicon), which extends through the insulating region 23 and has a main extension parallel to the axis X. In the embodiment described by way of example and during use of the power device 1, the first and second portions 50a, 50b are adapted to acquire the Hall voltage $V_H$ of the sensor 30, whereas the third portion 50c is adapted to provide an appropriate biasing to the drain region. Likewise, further portions (not illustrated in the section view of FIG. 1) of the first metallization layer MTL1 are electrically connected to the source regions to supply them with an appropriate biasing, and to the first and second arms 7, 8 for biasing the sensor 30 (in detail, for delivering the supply current $I_a$).

The second metallization layer MTL2 illustrated in FIG. 3 has a main extension parallel to the axis X and a thickness greater than the thickness of the first metallization layer MTL1. The section view of FIG. 1 corresponds to said second metallization layer MTL2 (i.e., it is taken along the section line shown in FIG. 3, at a height corresponding to the second metallization layer MTL2). The fingers 26, 28 and the buses 22, 24 therefore belong to the second metallization layer MTL2. In particular, FIG. 3 shows, at least partially, the considered drain finger 28. The drain finger 28 is electrically connected to the third portion 50c of the first metallization layer MTL1 via one or more fourth contacts 52 (of conductive material such as metal, for example, W, Al, or Cu) extending through the insulating region 23. During use of the power device 1, the drain finger 28 is therefore adapted to distribute current towards the third portion 50c of the first metallization layer MTL1, which is then supplied to the drain terminal 49 for biasing the drain region. It is, however, pointed out that the power device 1 may comprise further metallization and/or interconnection layers (for example, further contacts), in a per se known manner to the person skilled in the art.

Figure 3A:
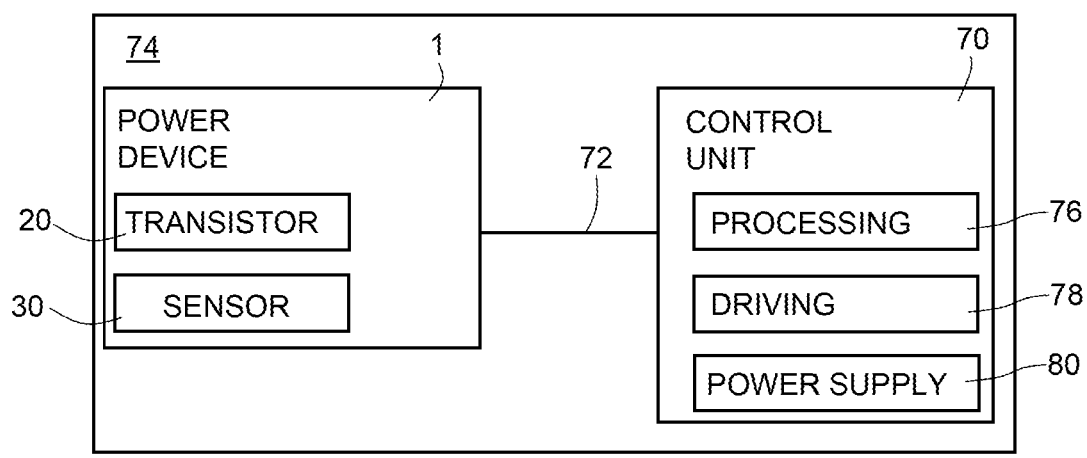
FIG. 3A schematically shows a system that includes the power device of FIG. 1, according to one embodiment of the present disclosure.

FIG. 3A shows a system 68 that comprises the power device 1 and a control unit 70. The power device 1 and the control unit 70 are electrically connected via one or more electrical connections 72, in a per se known manner. The control unit 70 is configured to provide a plurality of operative functions, amongst which managing biasing of the transistor 20, managing biasing of the sensor 30 (i.e., imposing the supply current $I_a$), to acquire the Hall potential $V_H$ thereof, and to process the acquired data (post-processing) in order to obtain the current that traverses the considered finger 26, 28. For this purpose, the control unit 70 (which may be integrated, with the power device 1, in a same die 74), comprises a processing unit 76, for example, a microcontroller or a microprocessor, for processing the data, a driving circuit 78 for driving the sensor 30 and/or the transistor 20, and possibly a supply circuit 80, of a type in itself known. According to one embodiment, the control unit 70 further comprises an output connection, configured to connect it to an external apparatus, adapted, for example, to read and display on a screen the measurement made by the sensor 30.

Figure 4A:
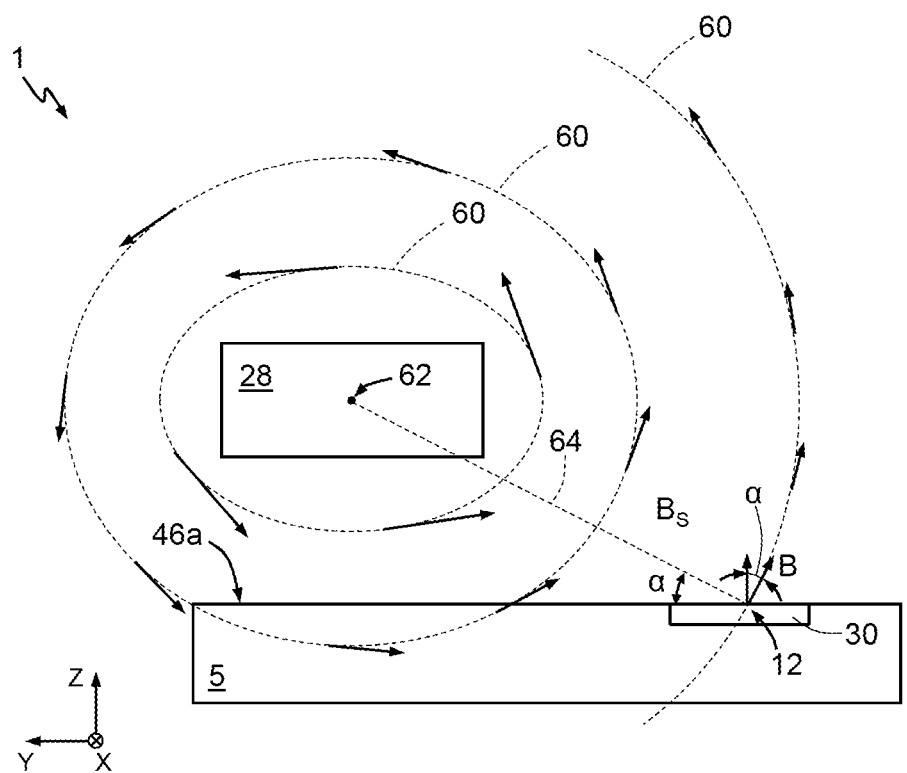
FIGS. 4A-4D are schematic section views of a detail of the power device, according to respective embodiments of the present disclosure.

With reference to the embodiment represented by way of example in FIG. 4A, operation of the power device 1 is described in detail hereinafter.

In particular, as discussed previously, during use of the power device 1, the drain finger 28 is configured to be traversed by the current. The current through the drain finger 28 generates, in a known way (for example, according to the Biot-Savart law), the respective magnetic field B. In detail, since the fingers 26, 28 have a width in a direction parallel to the axis Y much smaller than the corresponding length in a direction parallel to the axis X (for example, they have a width in a direction parallel to the axis Y smaller than 10% of the corresponding length in a direction parallel to the axis X), the generated magnetic field B has, in a plane parallel to the plane YZ, lines (designated by 60 in FIG. 4A) of magnetic field B that are concentric to one another and have a substantially elliptical or circular shape. In particular, assuming an elliptical shape for the lines 60 of magnetic field B, all the lines 60 of magnetic field B are centred on a point, hereinafter called centre of ellipse 62, which, according to one embodiment, coincides with a centroid of the drain finger 28 in the section parallel to the plane YZ (section line I-I). In a per se known way, the lines 60 of magnetic field B further away from the centre of ellipse 62 have a greater perimeter and a smaller intensity of magnetic field B (in a direction tangential to the aforesaid lines 60) than the lines 60 of magnetic field B closer to the centre of ellipse 62.

The sensor 30 is adapted to measure the measured magnetic field $B_s$ that traverses the conductive region 3 (in particular, the measured magnetic field $B_s$ at the central area 12). Since the sensor 30 has a planar structure, it is adapted to measure just one component of magnetic field perpendicular to the plane of lie of the sensor 30 (here parallel to the plane XY, and corresponding to the top surface 46a of the AlGaN layer 46). In other words, the measured magnetic field $B_s$ of FIG. 2 coincides with the magnetic field B when the magnetic field B is normal to the plane of lie of the sensor 30 (i.e., when the magnetic field B extends along the axis Z), and is equal to a projection of the magnetic field B along the axis Z when the magnetic field B does not have a normal incidence in the plane of lie of the sensor 30. According to one embodiment, the measured magnetic field $B_s$ is calculated, in scalar form, via the expression $B_s=B \cdot \cos(\alpha)$, where $\alpha$ is an inclination angle formed between a line of intersection 64 (which joins, and to which belong, the centre of ellipse 62 and the central area 12) and the top surface 46a of the AlGaN layer 46. According to one embodiment, the inclination angle $\alpha$ ranges between 0° (value not included) and 90°.

The control unit 70 is therefore configured to: acquire from the sensor 30 the measured Hall potential $V_H$; calculate, starting from the Hall potential $V_H$, the measured magnetic field $B_s$ according to per se known techniques (for example, by a linear relation between the Hall potential $V_H$ and the measured magnetic field $B_s$); and calculate the magnetic field B starting from the measured magnetic field $B_s$ (according to one embodiment, by applying the expression $B=B_s/\cos(\alpha)$). The value of the magnetic field B thus obtained is then associated, via the control unit 70, to a respective current value of the drain finger 28 (for example, via a purposely provided look-up table). For instance, during an appropriate procedure of measurement and/or electrical testing, precise and selected current values are supplied at input to the power device 1, and corresponding values of measured magnetic field $B_s$ acquired by the sensor 30 are read at output, and will then be written in the look-up table in a per se known manner.

Since the measured magnetic field $B_s$ is a function both of the intensity of the magnetic field B and of the inclination angle $\alpha$, as the position between the drain finger 28 and the sensor 30 varies, the sensitivity of the detection of the current in the drain finger 28 varies. In what follows, further embodiments of the power device 1 are described, which show the effect of this dependence of the measured magnetic field $B_s$.

Figure 5A:
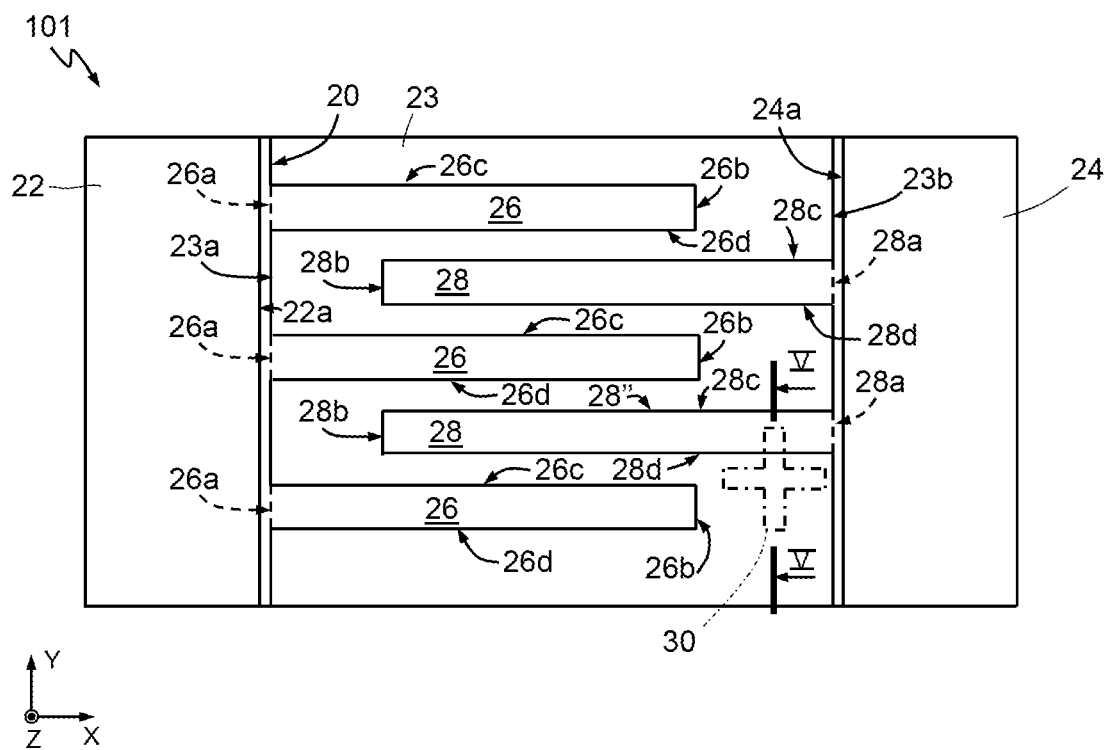
FIG. 5A is a section view of a different embodiment of the power device of FIG. 1.
Figure 5B:
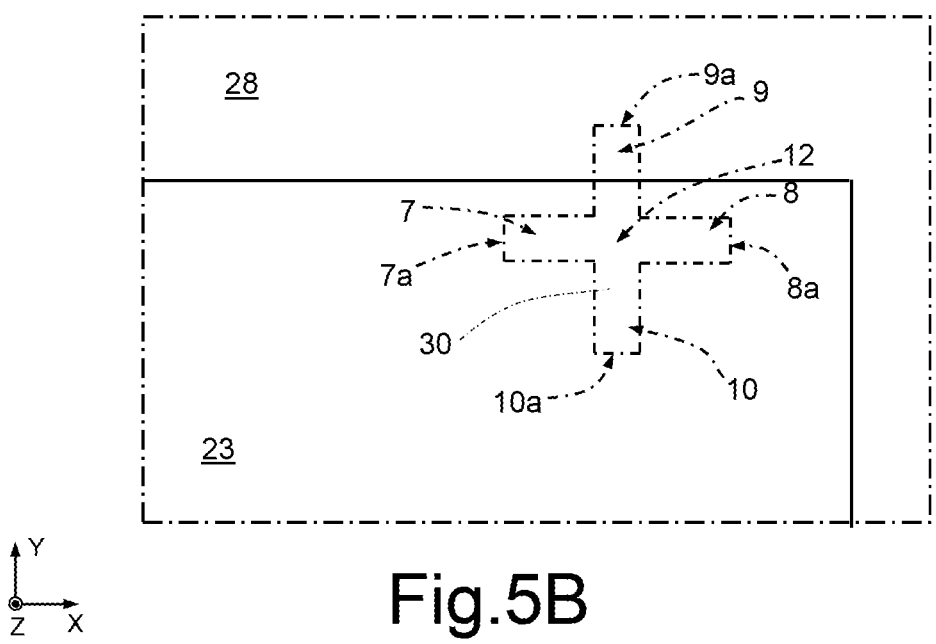
FIG. 5B shows an enlarged detail of the power device of FIG. 5A, according to one embodiment of the present disclosure.

In particular, FIG. 5A shows a different embodiment of the power device 1 (thus here designated by the reference number 101), wherein the sensor 30 (better shown in FIG. 5B) is shifted along the axis Y with respect to what is illustrated in the embodiment of FIG. 1.

According to the embodiment of FIG. 5A, in a view in the plane XY, the considered drain finger 28 (which is also designated by the reference number 28") and the sensor 30 are not laterally staggered, and the considered drain finger 28 is vertically set, at least partially, above (along the axis Z) the sensor 30. Stated differently, the drain finger 28 and the sensor 30 at least partially overlap each other. Pre-compensation of possible current pinch-off phenomena in the drain region during design of the power device 1 is known and is therefore not described any further. In particular, in FIG. 5A the drain finger 28 is vertically set above (along the axis Z) at least a part of the third arm 9. In detail, a seventh minimum path between the central area 12 and the second major side 28d of the drain finger 28 closer to the sensor 30 (i.e., the considered drain finger 28") in the present embodiment is shorter than the first minimum path of the embodiment of FIG. 1.

Figure 6:
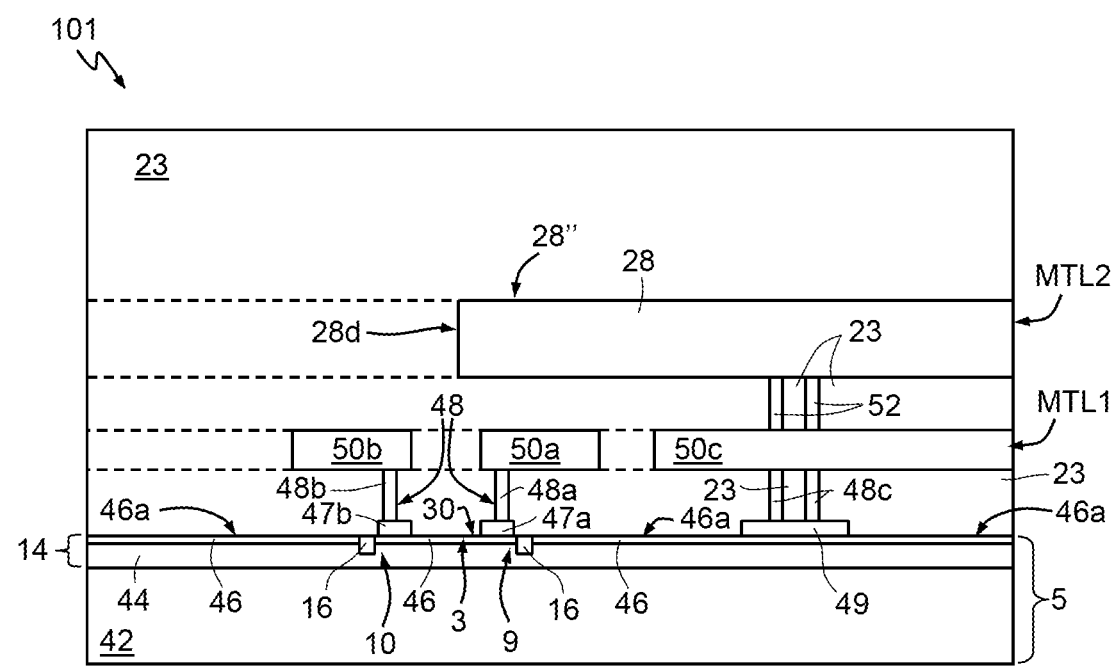
FIG. 6 is a section view of a detail of the power device of FIG. 5A, taken along a section line V-V of FIG. 5A, according to one embodiment of the present disclosure.
Figure 6:
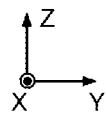

Moreover, the power device 101 is shown in section view (section line V-V) along the plane XY in FIG. 6. In particular, the second major side 28d of the drain finger 28 is in vertical correspondence (along the axis Z) with the sensor 30; i.e., in top view in the plane XY, it is set between the central area 12 and the third outer end 9a of the sensor 30.

Figure 4B:
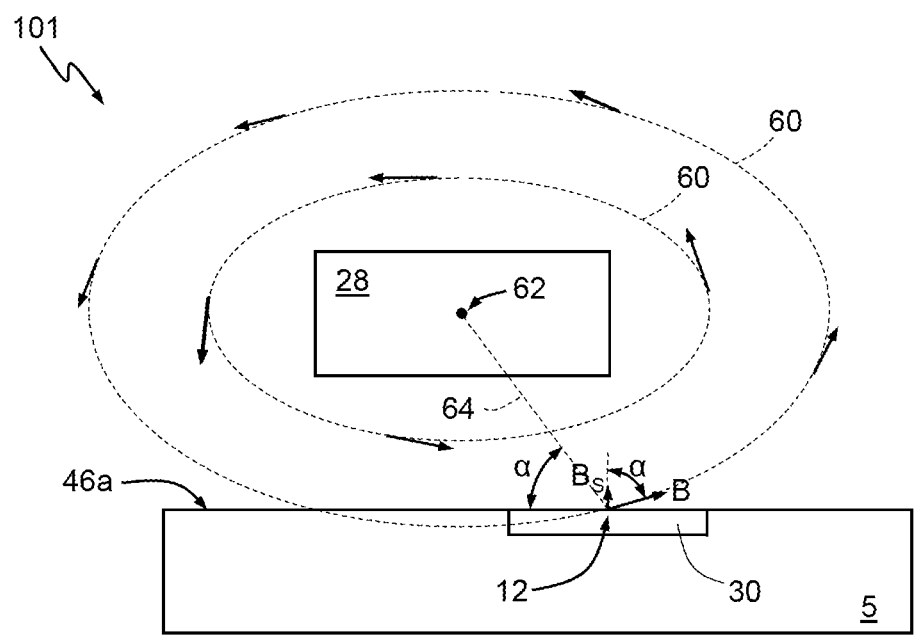

As shown in FIG. 4B, the power device 101 has the intersection line 64 smaller than the intersection line 64 of the power device 1. Since the distance between the centre of ellipse 62 and the top surface 46a of the AlGaN layer 46 is the same both in the power device 1 and in the power device 101 (given that it depends on the thicknesses, considered unvaried, of the metallization layers MTL1 and MTL2, and of the insulating region 23), the inclination angle $\alpha$ is greater (i.e., the value of $\cos(\alpha)$ is smaller) in the case of the power device 101 than in the case of the power device 1, and the intensity of the magnetic field B is higher.

Figure 4C:
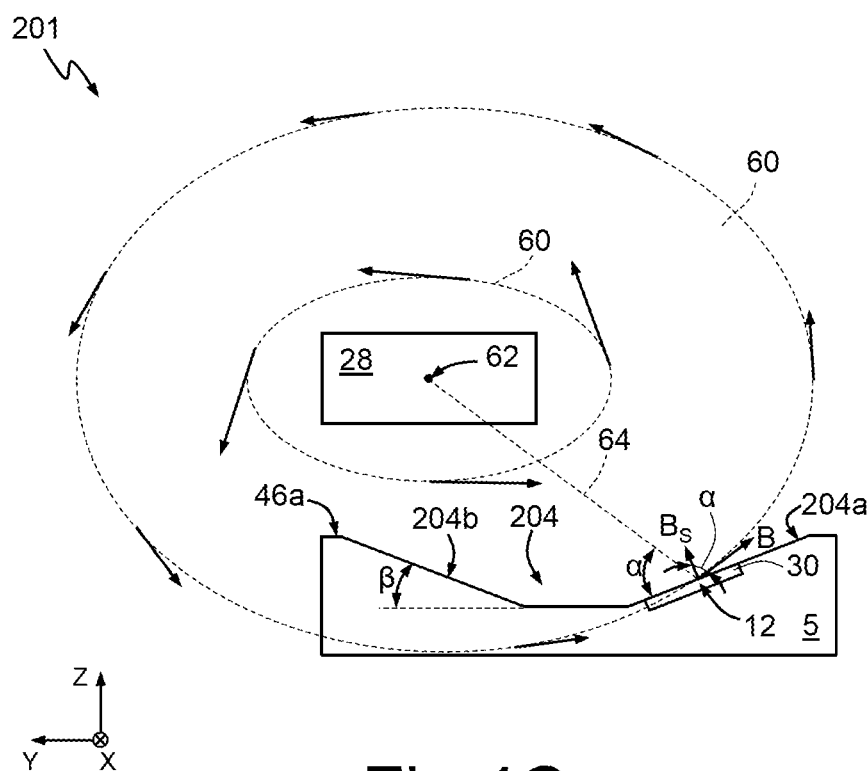

FIG. 4C illustrates a different embodiment of the power device 1 (thus here designated by the reference number 201), wherein the sensor 30 does not extend parallel to the plane XY, but extends in a trench 204. In particular, the semiconductor substrate 42 of the power device 201 comprises the trench 204, obtained, for example, via anisotropic etching followed by growth of the stack 14 and formation of the sensor 30, with per se known processes and not described any further herein. For instance, in the case where the semiconductor substrate 42 is of silicon with crystallographic orientation 100, the trench 204 is obtained via etching with potassium hydroxide (KOH). The trench 204 may have the shape of a pyramid or a pyramidal frustum (here with a square base having a side comprised between 150 μm and 300 μm), and has at least one first oblique wall 204a and one second oblique wall 204b, opposite to the first oblique wall 204a in the trench 204. In the case described by way of example, both the first oblique wall 204a and the second oblique wall 204b have a crystallographic orientation 111, extend in a direction transverse to the axes Y and Z and form, with respect to a plane parallel to the plane XY and to the top surface 46a of the AlGaN layer 46, an trench angle β (FIGS. 4C and 4D), which has an amplitude linked to the manufacturing process and to the particular used semiconductor material. In the present embodiment, given the frustopyramidal shape with a square base of the trench 204 and considering the semiconductor substrate 42 as being of silicon with crystallographic orientation 100, the trench angle β is equal to 54.7°.

In FIG. 4C, the sensor 30 extends along the first oblique wall 204a, thus enabling measurement of the magnetic field B and therefore of the current in the drain finger 28.

Figure 4D:
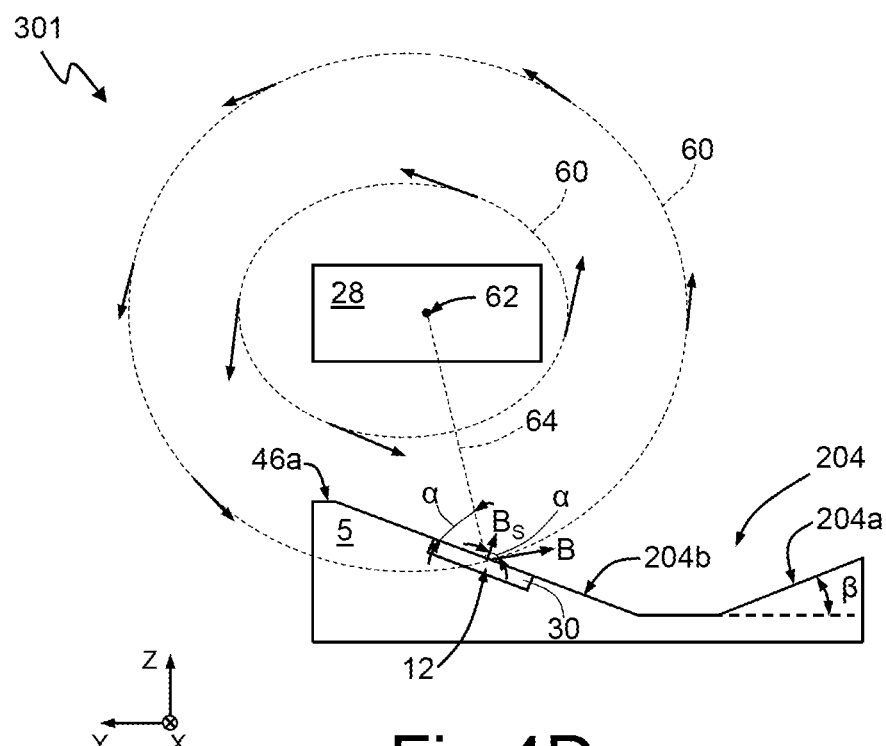

FIG. 4D shows a further embodiment of the power device 1 (therefore here designated by the reference number 301), in which the sensor 30 extends along the second oblique wall 204b. In this case, given the smaller line of intersection 64 and the small inclination angle α the sensor 30 is adapted to measure a higher value of magnetic field B, and the value of the measured magnetic field $B_s$ is close to that of the magnetic field B given the small inclination angle α thus guaranteeing a high sensitivity of measurement of the sensor 30.

Both in the case of FIG. 4C and in the case of FIG. 4D, the sensor 30 is arranged so that there exists an eighth minimum path between the central area 12 and at least one between the first and second major sides 28c, 28d of the considered drain finger 28. The eighth minimum path is shorter than any other path between the central area 12 of the sensor 30 and each of the first and second major sides 26c, 26d, 28c, 28d of the remaining fingers 26, 28.

Even though the embodiments of FIGS. 4C and 4D have been described, also the cases are considered wherein the trench 204 has shapes different from the one indicated (for example, trench with a triangular or hexagonal base, with three or six side walls), and/or the sensor 30 does not extend only along one of the oblique walls but lies on more than one oblique wall of the trench 204 (for example, on both of the oblique walls 204a, 204b and on a bottom wall of the trench 204), even though the central area 12 belongs to, and lies on, one of said oblique walls. Moreover, there is also considered the case wherein the trench 204 is replaced by a protrusion, in a per se known manner, as well as the case wherein the oblique walls do not extend in a direction transverse to the axes Y and Z (for example, they extend in a direction transverse to the axes X and Z and are inclined with respect to a plane parallel to the plane XY).

Figure 7:
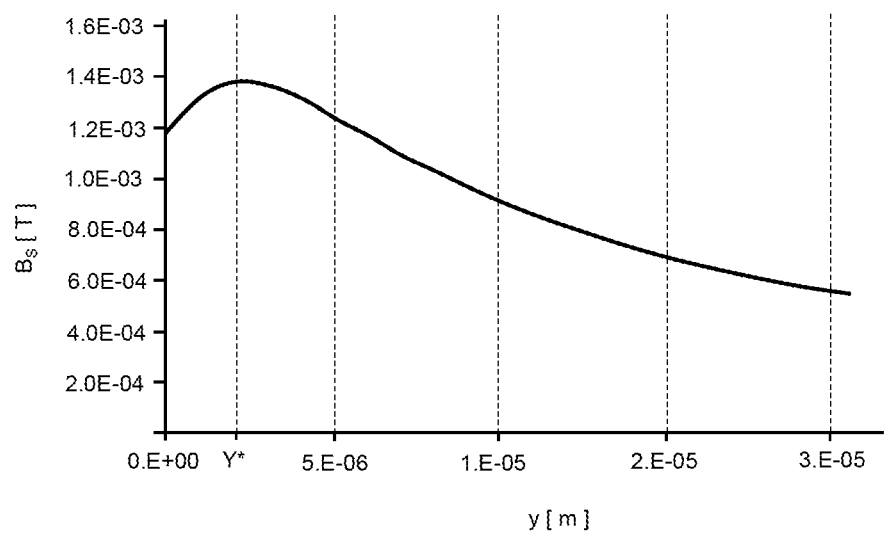
FIG. 7 is a graphic representation of a magnetic field measurement carried out by the power device of FIG. 1.

According to one embodiment (in particular, the one referring to the power device 1), FIG. 7 shows the behaviour of the measured magnetic field $B_s$ as the distance between the sensor 30 and the drain finger 28 varies. In particular, the values of measured magnetic field $B_s$ have been obtained by simulations in a per se known manner, considering: a thickness (along the axis Z) of the drain finger 28 of approximately 3 μm; minor sides 28a, 28b of the drain finger 28 of approximately 9 μm; current that traverses the drain finger 28 of approximately 70 mA (a value beyond which, with the present specifications, the likelihood of damage to the drain finger 28 on account of electromigration phenomena becomes non-negligible); and distance between the centre of ellipse 62 and the top surface 46a of the AlGaN layer 46 of approximately 4.5 μm. The measured magnetic field $B_s$ is represented as a function of the distance, taken along the axis Y (in detail, in top view parallel to the plane XY), between the second major side 28d of the considered drain finger 28 and the central area 12 of the sensor 30. In the graphic of FIG. 7, the origin of the axis of the abscissae corresponds to the second major side 28d of the drain finger 28, and the positive values of the abscissae correspond to the position along the axis Y moving from the second major side 28d towards the sensor 30. In detail, the measured magnetic field $B_s$ has, along the axis of the abscissae starting from the origin of the axes, an increasing trend followed by a decreasing trend.

The existence of the two trends and, consequently, of a maximum value of magnetic field measured at a certain distance of the sensor 30 from the drain finger 28 (i.e., at a certain offset between the sensor 30 and the drain finger 28) is the consequence of the distribution of the magnetic field B, which, as the distance from the drain finger 28 that generates it increases, impinges on the top surface 46a of the AlGaN layer 46 with an inclination increasingly closer to the normal, but with decreasing absolute value. The problem of correct positioning of the sensor 30 with respect to the drain finger 28 can therefore be formulated in terms of optimisation with two aims in conflict with one another (namely, the inclination angle α and the intensity of the magnetic field B), which leads to a trade-off corresponding to the peak value of the measured magnetic field $B_s$ that can be detected by the sensor 30.

In the example of FIG. 7, in fact, at a value Y* of the distance between the second major side 28d and the central area 12, the measured magnetic field $B_s$ has a peak value. The value Y* is the intermediate between the values of the distance of the second major side 28d from the central area 12 for which the measured magnetic field $B_s$ has an increasing plot and the values of the distance of the second major side 28d from the central area 12 for which the measured magnetic field $B_s$ has a decreasing plot. In the present embodiment, the value Y* is approximately 1.5 μm, and the corresponding measured magnetic field $B_s$ is approximately 1.4 mT. This value Y* therefore enables optimisation of the sensitivity of the sensor 30.

The advantages of the present disclosure are evident from what has been described above.

In particular, the power device 1, 101, 201, 301 presents small dimensions and can be integrated in a die, and the sensor 30 guarantees high measurement sensitivity of the magnetic field B since it is based on the Hall effect. In particular, the sensor 30, at least in the case of the 2DEG ballistic implementation, enables measurement of magnetic fields of the order of magnitude of the Earth's magnetic field (generally in the range of from 20 μT to 70 μT).

The sensor 30 is adapted to carry out a measurement of the magnetic field B that is galvanically insulated from the current that traverses the transistor 20, therefore enabling calculation of the current flowing in the fingers 26, 28, without reducing the efficiency and performance of the transistor 20.

The power device 1, 101, 201, 301 does not require a complex circuitry to operate, therefore reducing the manufacturing complexity and increasing the practicality of use thereof. In addition, the power device 1, 101, 201, 301 makes it possible to provide a control system of a closed-loop type that enables monitoring of the amount of current in the fingers 26, 28. It is therefore possible to respond rapidly to situations such as short-circuits and/or overcurrents in the transistor 20, preventing damage to the transistor 20, or to further components operatively coupled to the sensor 30.

Moreover, positioning the sensor 30 in the proximity of the first minor sides 26a, 28a of the fingers 26, 28 enables measurement of the current that traverses them in the area where it is maximum and where the effects of field caused by the fingers 26, 28 that are close (in particular, superposition of a number of magnetic fields B generated by different fingers 26, 28 that are close to one another and close to the sensor 30) are minimal.

Furthermore, the absence of connections between the sensor 30 and the transistor 20 simplifies the overall layout of the system as compared to the case of measurement circuits in which the sensor 30 and the transistor 20 are galvanically connected together.

Finally, it is clear that modifications and variations may be made to what has been described and illustrated herein, without thereby departing from the scope of the present disclosure.

In particular, according to a further embodiment, the sensor 30 extends between two drain fingers 28 (alternatively, between two source fingers 26). In detail, there is here considered the case provided by way of example of a first drain finger 28 and a second drain finger 28 (close to one another and consecutive in the series of drain fingers 28), where the second major side 28d of the first drain finger 28 and the first major side 28c of the second drain finger 28 face, at least partially, a same source finger 26 (respectively, the first major side 26c and the second major side 26d of the aforesaid source finger 26). For instance, in a top view parallel to the plane XY, the first outer end 7a faces the second minor side 26b of the source finger 26, the second outer end 8a faces the second surface 23b of the insulating region 23, the third outer end 9a faces the second major side 28d of the first drain finger 28, and the fourth outer end 10a faces the first major side 28c of the second drain finger 28.

Moreover, according to a further embodiment, it is possible to have a plurality of sensors 30 in the power device, for example, in positions corresponding to the same considered drain finger 28" (alternatively, the same considered source finger 26). In particular, a first sensor 30a and a second sensor 30b (which are similar to the sensor 30 and are therefore not described any further) are, in view in the plane XY, set facing and opposite to one another in a direction parallel to the axis Y with respect to the considered drain finger 28", so as to enable a differential measurement of the magnetic field B generated by the aforesaid considered drain finger 28". In greater detail, the first sensor 30a faces the first major side 28c (alternatively, the first major side 26c) and the second sensor 30b faces the second major side 28d (alternatively, the second major side 26d) of the drain finger 28", therefore enabling measurement of a differential type. The first and second sensors 30a, 30b are the same as one another and symmetrical in top view (i.e., parallel to the plane XY), with respect to the drain finger 28" (alternatively, to the source finger 26) considered. The first and second sensors 30a, 30b are therefore arranged so as to measure the same line 60 of magnetic field B, and, in detail, the magnetic fields B in the respective central areas 12 have directions opposite to one another. It is therefore possible, according to techniques in themselves known, to eliminate a common mode of the measurement of the first and second sensors 30a, 30b, thus improving the signal-to-noise ratio (SNR) of the overall measurement.

According to a further embodiment, the accuracy of the detection of the current that flows in the considered drain finger 28" (likewise, in the source finger 26) is improved by exploiting a further plurality of sensors 30 (for example, a third sensor 30c and a fourth sensor 30d) operatively coupled to the same transistor 20. The third and fourth sensors 30c, 30d are similar to the sensor 30 described previously, and in particular the fourth sensor 30d includes a respective conductive region 3 that is cross-shaped with a central area 12. The third sensor 30c is arranged in the power device so as to measure the magnetic field B generated by the drain finger 28" (in particular, according to one of the arrangements of the sensor 30 discussed previously with reference to the power devices 1, 101, 201, 301), and the fourth sensor 30d is arranged so as to measure an electromagnetic disturbance around the aforesaid drain finger 28" (in particular, the drain finger 28" is vertically set above, along the axis Z, the central area 12 of the fourth sensor 30d). In fact, by setting the drain finger 28" so that it is also vertically above, in view in the plane XY, the central area 12 of the fourth sensor 30d, the measured magnetic field $B_s$ acquired via the fourth sensor 30d indicates above all the magnetic fields B produced by the fingers 26, 28 close to the drain finger 28" (given the small value of cos(α) in the case of the magnetic field B generated by the drain finger 28", which makes the fourth sensor 30d insensitive to the magnetic field B generated by the drain finger 28") and/or contributions coming from external disturbance. Via the control unit 70 it is therefore possible to compensate the measurement made by the third sensor 30c with the one made by the fourth sensor 30d (for example, by subtracting the measured magnetic field $B_s$ of the fourth sensor 30d from the measured magnetic field $B_s$ of the third sensor 30c), thus improving the sensitivity and accuracy of detection. Likewise, the fourth sensor 30d can be arranged so as to measure the contribution of the magnetic field B due to one of the buses 22, 24, to eliminate said contribution via the control unit 70.

Furthermore, the transistor 20 may differ from the one described previously. In particular, it may be a power device of a known type, for example, a power diode or a microelectronic device. An example of further power device is the one described in the paper "Utilising Advanced Packaging Technologies to Enable Smaller, More Efficient GaN Power Devices", by A. Longford et al., EMPC 2013.

The sensor 30 may moreover not be operatively coupled to one or more fingers 26, 28, but can extend in the power device so as to be operatively coupled to one or more elements of the transistor 20 that are adapted, in use, for being traversed by a respective current to be measured. According to one embodiment, the sensor 30 is operatively coupled to one or more buses 22, 24, and enables measurement of the current that traverses said buses 22, 24. Moreover, with reference to this embodiment, the present applicant has found that, by positioning the sensor 30 laterally with respect to the bus 22, 24 and outside the interdigitated channel, no significant problems of electromagnetic interference between the bus 22, 24 and the fingers 26, 28 arise.

In addition, the sensor 30 may have a shape different from the cross shape illustrated previously, and may take the form of any one from among a plurality of different known embodiments of Hall-effect magnetic sensors (see, for example, "Solid-State Magnetic Sensors", Handbook of sensors and actuators 2, Chavdar S. Roumenin, et al., Elsevier, 1984), which include, for example, circular shapes, polygonal shapes (such as octagonal shapes or square shapes) and shapes of a more complex geometry.

The Hall-effect sensor 30 may even not include the heterostructure, and therefore not be based on 2DEG. In particular, it may moreover be manufactured by a respective layer, deposited or grown (for example, epitaxially), of semiconductor material other than silicon, or of metal conductive material (for example, aluminium, copper, gold, tungsten, etc.).

According to an alternative embodiment, the sensor 30 is not based on the Hall effect, but is a planar magnetic sensor of a type in itself known.

In addition, the semiconductor substrate 42 may be of a semiconductor material other than silicon, such as GaN or GaAs, which affords better adhesion to the stack 14.

The transistor 20 may also be based on a technology alternative to GaN technology (i.e., it may not comprise one or more layers of GaN involved in conduction); for example, it may be of silicon or gallium arsenide, or other semiconductor materials.

Although in the foregoing figures and description the arms 7, 8, 9, 10 of the sensor 30 have been indicated as being parallel to the axes X or Y, this arrangement is not indispensable, and other angular orientations are possible.

Figure 8:
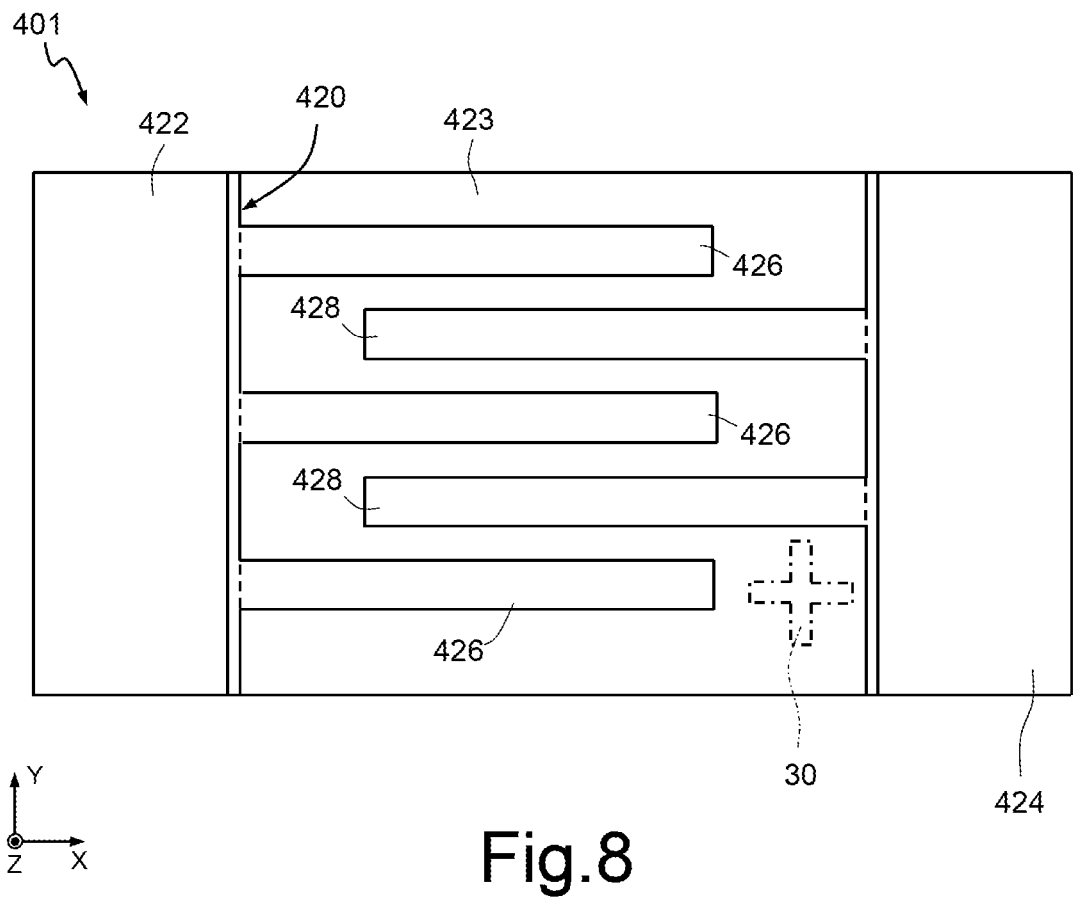
FIG. 8 illustrates, in section view, a different embodiment of the power devices of FIGS. 1 and 5A.

In a further embodiment illustrated in FIG. 8, what has been discussed previously is applied to passive devices. In particular, a power device 401 includes the sensor 30 and a capacitor 420 (in particular, a power capacitor). In this embodiment, the capacitor 420 is made with interdigitated electrodes and can have the function, in power circuits, of filtering voltage and current peaks (which in a power circuit can reach values even ten times higher than the normal operating values, and, for example, a peak value of the current may exceed 10 A). In fact, such voltage and current peaks can damage circuits electrically connected to the capacitor 420. The presence of the sensor 30, together with the processing unit 70, enables reduction of said peaks or causes disabling of the circuits that might get damaged. As has been previously described with reference to the power devices 1, 101, 201, 301, the capacitor 420 in the power device 401 comprises: a semiconductor body 405; an insulating region 423 extending on the semiconductor body 405; a plurality of first fingers 426, which extend in the insulating region 423 and define a first plate of the capacitor 420, each first finger 426 having a strip-shape or rectangular shape with main direction of extension parallel to the axis X; a plurality of second fingers 428, which extend in the insulating region 423 and define a second plate of the capacitor 420, each second finger 428 having a strip-shape with main direction of extension parallel to the axis X; a first bus 422, which extends in the insulating region 423 and is electrically coupled to the plurality of first fingers 426 for biasing the plurality of first fingers 426; and a second bus 424, which extends in the insulating region 423 and is electrically coupled to the plurality of second fingers 428 for biasing the plurality of second fingers 428. In detail, each first finger 426 alternates with, faces, and is electrically insulated from, a respective second finger 428 along the axis Y, and the sensor 30 is arranged so as to measure the magnetic field B produced, at least partially, by one of the following: the first bus 422; the second bus 424; one of the first fingers 426; and one of the second fingers 428. The arrangement of the sensor 30 in the power device 401 is similar to what has been illustrated and described previously with reference to the power devices 1, 101, 201, 301, and therefore is not described any further herein.

Moreover, even though the control unit 70 has been described with reference to FIG. 3A, wherein the power device 1 is present, the control unit 70 can likewise be electrically and operatively connected to the power device according to any one of the various embodiments previously described (in particular, to the power device 101, 201, 301, 401). In addition, the control unit 70 can be integrated in a die separated from the power device 1, 101, 201, 301, 401 and electrically connected thereto.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A power device comprising:
   a first plurality of conductive fingers;
   a second plurality of conductive fingers, at least one of the first plurality of conductive fingers being positioned between two conductive fingers of the second plurality of conductive fingers, the first plurality of conductive fingers being electrically insulated from the second plurality of conductive fingers;
   a first bus electrically coupled to the first plurality of conductive fingers;
   a second bus electrically coupled to the second plurality of conductive fingers; and
   a Hall sensor electrically insulated from the first plurality of conductive fingers, the second plurality of conductive fingers, the first bus, and the second bus,
   wherein the Hall sensor and a conductive element are arranged such that the Hall sensor is able to detect a magnetic field generated by the conductive element,
   the magnetic field is indicative of a current that traverses the conductive element, and
   the conductive element is a conductive finger of the first plurality of conductive fingers, a conductive finger of the second plurality of conductive fingers, the first bus, or the second bus.

2. The power device according to claim 1, further comprising:
   a transistor including:
      a semiconductor body;
      a source terminal;
      a drain terminal;
      a gate terminal, the source, drain, and gate terminals being electrically coupled to the semiconductor body so that, when biased, a current flows in the semiconductor body between the drain terminal and the source terminal;
      an insulating region on the semiconductor body;
      the first plurality of conductive fingers on the insulating region and electrically coupled to the source terminal, each of the first plurality of conductive fingers having a rectangular shape with a main extension direction parallel to a first axis;
      the second plurality of conductive fingers on the insulating region and electrically coupled to the drain terminal, each of the second plurality of conductive fingers having a rectangular shape with a main extension direction parallel to the first axis;
      the first bus on the insulating region, the first bus configured to bias the source terminal; and
      second bus on the insulating region, the second bus configured to bias the drain terminal, wherein each of the first plurality of conductive fingers faces and is electrically insulated from a respective conductive finger of the second plurality of conductive fingers along a second axis perpendicular to the first axis.

3. The power device according to claim 2,
wherein each of the second plurality of conductive fingers includes:
a first major side and a second major side extending parallel to the first axis; and
a first minor side and a second minor side extending parallel to the second axis,
wherein each of the first plurality of conductive fingers includes:
a first major side and a second major side extending parallel to the first axis; and
a first minor side and a second minor side extending parallel to the second axis, and
wherein the first minor side of each of the first plurality of conductive fingers is electrically connected to the first bus, and the first minor side of each of the second plurality of conductive fingers is electrically connected to the second bus.

4. The power device according to claim 3, further comprising:
an insulating layer, wherein the Hall sensor includes a conductive region having a cross-shape with a centroid extending in a plane defined by the first axis and by the second axis, the conductive region is formed in or on the semiconductor body, and the conductive region is electrically insulated from the semiconductor body by the insulating layer.

5. The power device according to claim 4, wherein the semiconductor body includes at least a heterostructure configured to form a two-dimensional electron gas region, and
the transistor is a high electron mobility field-effect transistor including a first portion of the heterostructure or the conductive region includes a second portion, electrically insulated from the first portion, of the heterostructure.

6. The power device according to claim 4, wherein the conductive element is a conductive finger chosen among the second plurality of conductive fingers,
the Hall sensor is arranged such that there exists a minimum distance between the centroid and at least one of the first or the second major sides of the conductive finger chosen among the second plurality of conductive fingers, and
the minimum distance is shorter than any other distance between the centroid and each of the first and second major sides of remaining conductive fingers of the second plurality of conductive fingers.

7. The power device according to claim 4, wherein the conductive element is a conductive finger chosen among the first plurality of conductive fingers,
the Hall sensor is arranged such that there exists a minimum distance between the centroid and at least one of the first or the second major sides of the conductive finger chosen among the first plurality of conductive fingers, and
the minimum distance is shorter than any other distance between the centroid and each of the first and second major sides of remaining conductive fingers of the first plurality of conductive fingers.

8. The power device according to claim 7, wherein the centroid is closer to the first minor side of the conductive finger chosen among the first plurality of conductive fingers than to the second minor side of the conductive finger chosen among the first plurality of conductive fingers.

9. The power device according to claim 7, wherein, in a view in the plane, the conductive element and the Hall sensor are laterally spaced apart with respect to one another.

10. The power device according to claim 7, wherein, in a view in the plane, the conductive element and the Hall sensor partially overlap each other.

11. The power device according to claim 4, further comprising:
another Hall sensor, the Hall sensor and the another Hall sensor being, in a view in the plane, set facing the conductive element and being opposite to one another in a direction parallel to the second axis with respect to the conductive element so as to enable a differential measurement of the magnetic field.

12. The power device according to claim 4, further comprising:
another Hall sensor including a conductive region that is cross-shaped with a centroid, wherein the conductive element and the centroid of the another Hall sensor overlap each other.

13. The power device according to claim 3, further comprising an insulating layer, wherein:
the semiconductor body includes a trench or a protrusion having a wall inclined with respect to a plane formed by the first axis and by the second axis,
the Hall sensor includes a conductive region having a centroid and extending along the wall,
the conductive region is electrically insulated from the semiconductor body by the insulating layer,
the conductive element is a conductive finger chosen among the second plurality of conductive fingers or a conductive finger chosen among the first plurality of conductive fingers,
the Hall sensor is arranged so that there exists a minimum distance between the centroid and at least one of the first or second major sides of the conductive finger chosen among the second plurality of conductive fingers or of the conductive finger chosen among the first plurality of conductive fingers, and
the minimum distance is shorter than any other distances between the centroid and each of the first and second major sides of remaining conductive fingers among the second plurality of conductive fingers or conductive fingers of the first plurality of conductive fingers.

14. The power device according to claim 2, further comprising:
another conductive element, wherein:
the at conductive element is one of a conductive finger of the second plurality of conductive fingers or a conductive finger of the first plurality of conductive fingers that directly face one another along the second axis,
the another conductive element is the other one of the conductive finger of the second plurality of conductive fingers and the conductive finger of the first plurality of conductive fingers that directly face one another along the second axis, and
the Hall sensor is positioned, in a view in a plane defined by the first axis and by the second axis, between the conductive finger of the second plurality of conductive fingers and the conductive finger of the first plurality of conductive fingers that directly face one another.

15. The power device according to claim 1, further comprising:
a capacitor including:

a semiconductor body;

an insulating region on the semiconductor body;

the first plurality of conductive fingers on the insulating region, the first plurality of conductive fingers being first plate of the capacitor, each of the first plurality of conductive fingers having a rectangular shape with a main extension direction parallel to a first axis;

the second plurality of conductive fingers on the insulating region, the second plurality of conductive fingers being a second plate of the capacitor, each of the second plurality of conductive fingers having a rectangular shape with a main extension direction parallel to the first axis;

the first bus on the insulating region, the first bus configured to bias the first plurality of conductive fingers; and the second bus on the insulating region, the second bus configured to bias the second plurality of conductive fingers, wherein each of the first plurality of conductive fingers faces and is electrically insulated from a respective conductive finger of the second plurality of conductive fingers along a second axis perpendicular to the first axis.

16. The power device according to claim 1, wherein the Hall Sensor includes a two-dimensional electron gas (2DEG) region.

17. A system comprising:

a power device including:

a first plurality of conductive fingers;

a second plurality of conductive fingers, at least one of the first plurality of conductive fingers being positioned between two conductive fingers of the second plurality of conductive fingers, the first plurality of conductive fingers being electrically insulated from the second plurality of conductive fingers;

a first bus electrically coupled to the first plurality of conductive fingers;

a second bus electrically coupled to the second plurality of conductive fingers; and a Hall sensor electrically insulated from the first plurality of conductive fingers, the second plurality of conductive fingers, the first bus, and the second bus, wherein the Hall sensor and a conductive element are arranged such that the Hall sensor is able to detect a magnetic field generated by the conductive element, the magnetic field is indicative of a current that traverses the conductive element, and the conductive element is a conductive finger of the first plurality of conductive fingers, a conductive finger of the second plurality of conductive fingers, the first bus, or the second bus; and a control unit operatively coupled to the power device via electrical connections and configured to:

acquire, via the Hall sensor, a Hall potential indicative of the magnetic field;

calculate a measured magnetic field based on the Hall potential;

calculate the magnetic field based on the measured magnetic field; and associate to the calculated magnetic field with the current of the conductive element.

18. The system according to claim 17, wherein each of the first plurality of conductive fingers has a rectangular shape, and each of the second plurality of conductive fingers has a rectangular shape.

19. A method for manufacturing a power device, the method comprising:

forming a first plurality of conductive fingers;

forming a second plurality of conductive fingers, at least one of the first plurality of conductive fingers being positioned between two conductive fingers of the second plurality of conductive fingers, the first plurality of conductive fingers being electrically insulated from the second plurality of conductive fingers;

forming a first bus electrically coupled to the first plurality of conductive fingers;

forming a second bus electrically coupled to the second plurality of conductive fingers; and forming a Hall sensor that is electrically insulated from the first plurality of conductive fingers, the second plurality of conductive fingers, the first bus, and the second bus, wherein the Hall sensor and a conductive element are arranged such that the Hall sensor is able to detect a magnetic field generated by the conductive element, the magnetic field is indicative of a current that traverses the conductive element, and the conductive element is a conductive finger of the first plurality of conductive fingers, a conductive finger of the second plurality of conductive fingers, the first bus, or the second bus.

20. The method according to claim 19, wherein each of the first plurality of conductive fingers has a rectangular shape, and each of the second plurality of conductive fingers has a rectangular shape.

21. A method for controlling a power device operatively coupled to a control unit, the method comprising:

acquiring, by the control unit and via a Hall sensor of the power device, a Hall potential indicating a magnetic field generated by a current that traverses a conductive element of the power device, the power device including:

a first plurality of conductive fingers;

a second plurality of conductive fingers, at least one of the first plurality of conductive fingers being positioned between two conductive fingers of the second plurality of conductive fingers, the first plurality of conductive fingers being electrically insulated from the second plurality of conductive fingers;

a first bus electrically coupled to the first plurality of conductive fingers;

a second bus electrically coupled to the second plurality of conductive fingers; and the Hall sensor electrically insulated from the first plurality of conductive fingers, the second plurality of conductive fingers, the first bus, and the second bus, wherein the conductive element is a conductive finger of the first plurality of conductive fingers, a conductive finger of the second plurality of conductive fingers, the first bus, or the second bus;

calculating, by the control unit, a measured magnetic field based on the Hall potential;

calculating, by the control unit, the magnetic field based on the measured magnetic field; and associating, by the control unit, the calculated magnetic field with the current of the conductive element.

* * * * *